US011882672B2

(12) United States Patent
Chen et al.

(10) Patent No.: US 11,882,672 B2
(45) Date of Patent: Jan. 23, 2024

(54) ANTI-LEAKAGE LIQUID COOLING CONNECTORS

(71) Applicant: Quanta Computer Inc., Taoyuan (TW)

(72) Inventors: Chao-Jung Chen, Taoyuan (TW); Yu-Nien Huang, Taoyuan (TW); Herman Tan, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 364 days.

(21) Appl. No.: 17/204,528

(22) Filed: Mar. 17, 2021

(65) Prior Publication Data

US 2022/0159874 A1    May 19, 2022

Related U.S. Application Data

(60) Provisional application No. 63/114,293, filed on Nov. 16, 2020.

(51) Int. Cl.
*F16L 19/02* (2006.01)
*H05K 7/20* (2006.01)
(Continued)

(52) U.S. Cl.
CPC ...... *H05K 7/20327* (2013.01); *F16L 19/0206* (2013.01); *F28F 3/12* (2013.01); *H01R 13/11* (2013.01); *H05K 7/20254* (2013.01)

(58) Field of Classification Search
CPC ... F16L 19/0206; F16L 19/028; F16L 19/025; F16L 19/0283; F16L 19/0286
See application file for complete search history.

(56) References Cited

U.S. PATENT DOCUMENTS

| | | | | |
|---|---|---|---|---|
| 1,733,925 A | * | 10/1929 | Weatherhead, Jr. | .. F16L 19/005 |
| | | | | 285/382 |
| 2,952,481 A | * | 9/1960 | Weatherhead, Jr. | .... F16L 19/04 |
| | | | | 285/353 |

(Continued)

FOREIGN PATENT DOCUMENTS

| EP | 2679873 A1 | * | 1/2014 | ............ B60T 17/043 |
|---|---|---|---|---|
| FR | 1390727 A | * | 2/1965 | |

(Continued)

OTHER PUBLICATIONS

TW Office Action for Application No. 110123913, dated Jan. 5, 2022, w/ First Office Action Summary.

*Primary Examiner* — Zachary T Dragicevich
*Assistant Examiner* — James A Linford
(74) *Attorney, Agent, or Firm* — NIXON PEABODY LLP (57) ABSTRACT

A device for a computing system is disclosed. The device includes a body, a socket, and a connector. The body includes a panel and an internal conduit. The connector extends from the panel. The connector is removably coupled to the socket. The connector includes an outer end and an inner end. The connector also includes a nut that has an exterior surface mating with a corresponding interior surface of the socket, and a tubular inlet. The connector also has a sleeve with an internal bore and an external surface abutting the tubular inlet of the nut. The internal conduit is coupled to the inner end of the connector to circulate cooling liquid through the body. The nut includes an angled portion and the sleeve includes a flared portion for assisting in securing the nut and the sleeve in the internal conduit.

8 Claims, 7 Drawing Sheets

(51) Int. Cl.
    *H01R 13/11*     (2006.01)
    *F28F 3/12*     (2006.01)

(56) References Cited

U.S. PATENT DOCUMENTS

| | | | | |
|---|---|---|---|---|
| 4,765,661 | A * | 8/1988 | Fukushima | F16L 19/046 |
| | | | | 29/523 |
| 10,952,354 | B1 * | 3/2021 | Chen | H01L 23/46 |
| 2010/0156098 | A1 * | 6/2010 | Calnek | F16L 19/0283 |
| | | | | 285/137.11 |
| 2014/0144612 | A1 * | 5/2014 | Robb | E21B 36/006 |
| | | | | 165/170 |
| 2016/0128238 | A1 * | 5/2016 | Shedd | F25B 41/42 |
| | | | | 361/679.47 |
| 2016/0201841 | A1 * | 7/2016 | Heutchy | F16L 58/184 |
| | | | | 285/55 |

FOREIGN PATENT DOCUMENTS

| | | | | |
|---|---|---|---|---|
| FR | 2230923 | A1 * | 12/1974 | |
| FR | 2269020 | A1 * | 11/1975 | |
| GB | 2032035 | A * | 4/1980 | B60T 17/04 |
| TW | M302872 | U | 12/2006 | |
| TW | 201043910 | A1 | 12/2010 | |
| WO | WO-0118440 | A2 * | 3/2001 | F16L 19/0283 |
| WO | WO-2017216221 | A1 * | 12/2017 | B21D 19/00 |

\* cited by examiner

ANTI-LEAKAGE LIQUID COOLING CONNECTORS

CROSS-REFERENCE TO RELATED APPLICATIONS

This application claims priority under 35 U.S.C. § 119 to U.S. Provisional Application No. 63/114,293, entitled "Low Minor Loss Coupled with Anti Leakage Liquid Cooling Connector," and filed on Nov. 16, 2020. The contents of that application are hereby incorporated by reference in their entirety.

TECHNICAL FIELD

The present disclosure relates generally to a method for cooling computing system components, and more specifically, to a liquid cooling method that utilizes a cold plate for cooling components of a server system.

BACKGROUND

Computer enclosures and other types of electronic equipment often contain many electronic components that generate heat. Typically, the heat in such a system is confined by the enclosure and requires an additional component or method in order to reduce the temperature of the system. The heat generated by each component increases based on increases in processing power. Thus, overheating is a common issue, which can have a negative impact on the performance of the components in the system. Overheating reduces efficiency and may cause long term damage to the components.

A common way to reduce the temperature in a computing system is to include one or more fans in the system to increase air flow. Increasing air flow in the system usually decreases the temperature of the system in the aggregate. However, it may be difficult to target a specific electronic component that may produce more heat than others and, therefore, need more cooling measures. Thus, liquid cooling systems are often used for direct localized cooling and offer higher heat transfer rates than fans. Liquid cooling systems can be used as an alternative, or in conjunction, with fans.

Liquid cooling systems generally include a cold plate fabricated from a metal, and connections for tubes directing cooling liquid into and out of the cold plate. The cold plates are typically placed above components, such as processor units, that produce relatively high amounts of heat compared with other components of the system. Thus, it is very important for the liquid not to leak because that may cause damage to the rest of the system, especially the electrical components.

Additionally, connections for the cooling liquid to the cold plate typically include tubes of elastic material, such as rubber or PVC. Elastic tubes are likely to degrade over time, which can be a source for leaking. Similarly, O-rings may be used to seal the connections between the cold plate and the tubing. However, O-rings are typically made of elastic material and, thus, can also degrade over time, especially due to high liquid coolant pressure in the system. Cold plates have an area where the pressure increases as the liquid leaves the cold plate in order to reduce leakage. The high pressure is due to a decrease in the diameter of the internal conduit of the cold plate relative to the diameter of the connection from the cold plate to the tube.

Thus, there exists a need for a cooling system with secure connections. More specifically, there is a need for a cold plate system that has a lower likelihood of leakage, by using connections that are less likely to degrade over time. There is also a need for a connection that smoothly transitions the change in pressure between the cold plate and the liquid cooling tube, thereby reducing areas of high pressure. There is also a need for a cooling system that does not degrade easily over prolonged periods of time due to temperature or wear.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings and each claim.

According to one aspect of the present disclosure, a device for a computing system is disclosed. The device includes a body, a socket, and a connector. The body includes a panel and an internal conduit. The connector extends from the panel. The connector is removably coupled to the socket. The connector includes an outer end and an inner end, a nut and a sleeve. The nut has an exterior surface mating with a corresponding interior surface of the socket, and a tubular inlet. The sleeve with an internal bore and an external surface abutting the tubular inlet of the nut. The internal conduit is coupled to the inner end of the connector to circulate cooling liquid through the body.

According to a configuration of the above implementation, the nut includes an angled portion and the sleeve includes a flared portion for assisting in securing the nut and the sleeve in the internal conduit.

According to another configuration of the above implementation, the outer end of the connector is configured to be coupled to a tube.

In a further aspect of the above implementation, the exterior surface of the nut of the connector includes a plurality of threads configured to mate with threads on the socket.

In another aspect of the above implementation, the sleeve of the connector includes an outer diameter and an inner diameter. The inner diameter decreases from the inner end to the outer end of the connector.

According to another configuration of the above implementation, the outer diameter of the sleeve is less than the inner diameter of the nut.

In a further aspect of the above implementation, the device is formed from a metal.

In yet a further aspect of the above implementation, the internal conduit is U-shaped.

Another aspect of the present disclosure includes a cooling assembly for decreasing temperature in a computing system. The cooling assembly includes an inlet tube, an outlet tube, and a cold plate. The inlet tube is configured to transport liquid into the assembly. The outlet tube is configured to transport liquid out of the assembly. The cold plate includes a body, a first socket, a second socket, a first connector, and a second connector. The body includes a panel and an internal conduit. The first connector and the second connector extend from the panel. Each connector is configured to be coupled to either the first socket or the second socket. The first connector and the second connector each have an outer end and an inner end. Each connector also has a nut with an exterior surface mating with a corresponding interior surface of the first socket or the second socket, and a tubular inlet. Each connector also has a sleeve with an internal bore and an external surface abutting the tubular inlet of the nut. The internal conduit is coupled to the inner end of the first connector and the second connector to circulate cooling liquid between the first connector and the second connector. The inlet tube mates with the first connector and the outlet tube mates with the second connector.

According to a configuration of the above implementation, the nut includes an angled portion and the sleeve includes a flared portion for assisting in securing the nut and the sleeve in the internal conduit.

According to another configuration of the above implementation, the outer end of the first connector and the second connector are each configured to be coupled to a tube.

In a further aspect of the above implementation, the exterior surface of the nut of each connector includes a plurality of threads configured to mate with threads on the first socket or the second socket.

In another aspect of the above implementation, the sleeve of the first and the second connector includes an outer diameter and an inner diameter. The inner diameter decreases from the inner end to the outer end of the second connector.

According to another configuration of the above implementation, the outer diameter of the sleeve is less than the inner diameter of the nut.

In a further aspect of the above implementation, the cold plate is formed from a metal.

In yet a further aspect of the above implementation, the internal conduit is U-shaped.

Another aspect of the present disclosure includes a system. The system includes an inlet tube, an outlet tube, an electronic component, and a cold plate. The inlet tube is couplable to a circulation system of a liquid cooling system. The inlet tube transports liquid from the circulation system. The outlet tube is couplable to the liquid cooling system to transport liquid to the circulation system. The electronic component generates heat. The cold plate thermally connected to the electronic component. The cold plate includes a body, a first socket, a second socket, a first connector, and a second connector. The body includes a panel and an internal conduit. The first connector and the second connector extend from the panel. Each connector is configured to be coupled to the first socket and the second socket. The first connector and the second connector each have an outer end and an inner end. Each connector also has a nut with an exterior surface mating with a corresponding interior surface of the first socket or the second socket, and a tubular inlet. Each connector also has a sleeve with an internal bore and an external surface abutting the tubular inlet of the nut. The internal conduit is coupled to the inner end of the first connector and the second connector to circulate cooling liquid between the first connector and the second connector. The inlet tube mates with the first connector and the outlet tube mates with the second connector.

In a further aspect of the above implementation, the exterior surface of the nut of each connector includes a plurality of threads configured to mate with threads on the first socket or the second socket.

In another aspect of the above implementation, the sleeve of the first and the second connector includes an outer diameter and an inner diameter. The inner diameter decreases from the inner end to the outer end of each connector.

According to another configuration of the above implementation, the outer diameter of the sleeve is less than the inner diameter of the nut.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

While the invention is susceptible to various modifications and alternative forms, specific implementations have been shown by way of example in the drawings and will be described in further detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The various embodiments are not limited by the illustrated ordering of acts or events, as some acts may occur in different orders and/or concurrently with other acts or events. Furthermore, not all illustrated acts or events are required to implement a methodology in accordance with the present invention.

Elements and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa. The word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure is directed to a method of cooling using a cold plate. More specifically, the present disclosure is related to a cold plate system that has a lower likelihood of leakage and reduces areas of high pressure in the cold plate system.

Figure 1:
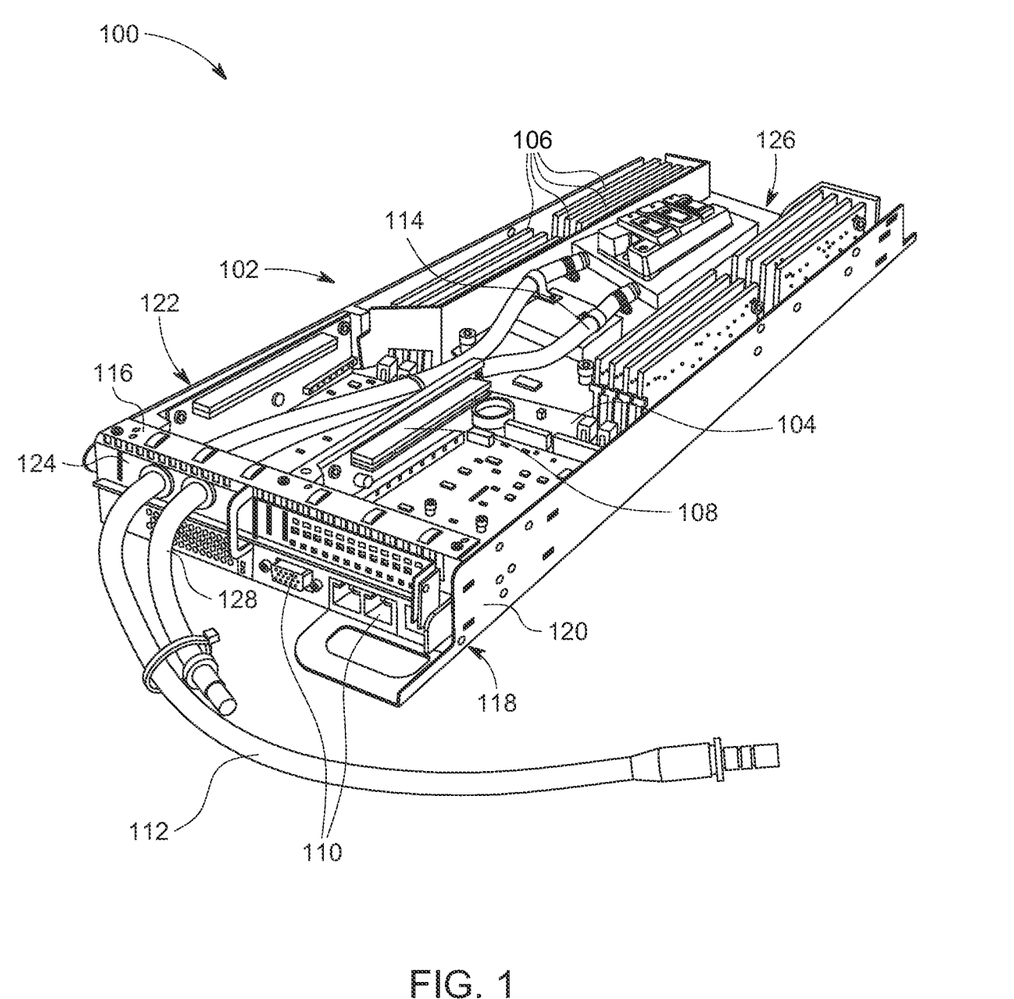
FIG. 1 is a perspective view of a computing system with an example cooling system in a chassis of the computing system.

FIG. 1 is a perspective view of a computing system, such as a server system 100, with a cooling system in a chassis 102 of the system 100. The illustrated server system 100 includes the chassis 102, a motherboard 104, memory modules 106, an add-on card bracket 108, a series of connection ports 110, a cooling liquid inlet tube 112, a cooling liquid outlet tube 128, and a cold plate 114. In other implementations, the server system 100 may include more than the listed components or less than the listed components. The chassis 102 includes a top panel 116, a bottom panel 118, a first side wall 120, a second side wall 122, a front wall 124, and a back wall 126 to enclose the electronic components of the system 100. The top panel 116 and the bottom panel 118 are generally perpendicular to the first side wall 120 and the second side wall 122.

In some implementations, the memory modules 106 are dual in-line memory modules (DIMMs) generally located near the back wall 126 and the first side wall 120. Another set of memory modules 106 is generally located near the back wall 126 and the second side wall 122. In this example, two processors are mounted between the memory modules 106 for ready access to the modules 106. The cold plate 114 may be located in the chassis 102, in between the memory modules 106, to transfer heat away from the processor. The inlet tube 112 may be connected to a portion of the cold plate 114. The add-on card bracket 108 may be located near the front wall 124. The series of connection ports 110 may also be located on the front wall 124. The motherboard 104 may be located on a portion of the chassis 102 nearest to the bottom panel 118.

The individual components of system 100 such as the processor may dissipate, generate, produce, or radiate heat. Thus, the heat in the system 100 may accumulate if a cooling mechanism is not implemented. The inlet tube 112, the outlet tube 128, and the cold plate 114 may function as a cooling system to decrease the overall temperature in the chassis 102. More specifically, the cold plate 114 of the system 100 may cool a component to a lower temperature by transferring heat to a cooling liquid, such as any mixture of water, deionized water, inhibited glycol, or dielectric fluids; including ethylene glycol, propylene glycol, HFE-7100, HFE-7300, R-134a; supplied by the inlet tube 112.

As a result, heat may be reduced based on the relatively lower temperature of the cold plate 114 absorbing the surrounding heat of the components near the cold plate 114. For example, the cold plate 114 may be attached, by thermal interface material, to a heat-producing processor. Thermal interface material ensures secure contact between the processor and the cold plate 114. Thus, heat from the processor is then conductively transferred to the cold plate 114, where the heat is then dissipated convectively by the cooling liquid. The outlet tube 128 then removes the heated liquid, out of the cold plate 114. The process continues while the inlet tube 112 and outlet tube 128 are in use, circulating the liquid to cool the system 100. The add-on card bracket 108 may also be considered a riser module.

Figure 2:
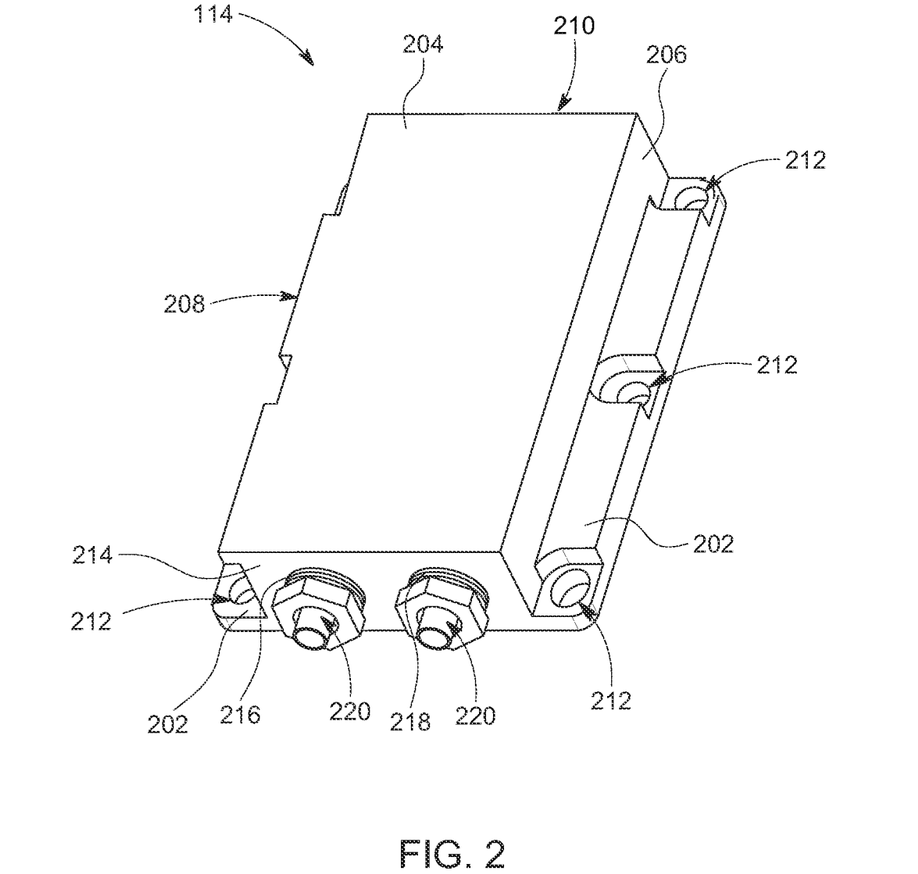
FIG. 2 is a perspective view of an example cold plate that allows for cooling liquid to flow through it.

FIG. 2 is a perspective view of an example cold plate 114 that allows for cooling liquid to flow through it. Like elements in FIG. 1 are labeled with the same reference numbers in FIG. 2. The cold plate 114 includes a base 202, a front panel 204, a first side panel 206, a second side panel 208, a top panel 210, and a bottom panel 214. The first side panel 206 and the second side panel 208 are generally parallel. The top panel 210 and the bottom panel 214 are generally parallel. The base 202 also includes holes 212. The holes 212 allow the cold plate 114 to be removably fastened to the chassis 102 or a bracket (not shown) on the motherboard 104 of the system 100, by a fastener. As illustrated, there are six holes 212 on the base 202. In some instances, there may be fewer or more than six connected fasteners and holes 212 on the base 202 for the cold plate 114 to be removably secured to a surface.

The cold plate 114 also includes a first socket 216 and a second socket 218 extending from the bottom panel 214. Each socket 216, 218 also includes a connector 220 located at an end of the respective sockets 216, 218, opposite of the bottom panel 214. The function of the sockets 216, 218 and the connector 220 are to ensure connection between the cold plate 114 and tube 112 and the cooling liquid outlet tube 128 (collectively 'the tubes 112, 128') transporting cooling liquid into and out of the cold plate 114, as shown in in FIG. 1.

Figure 3:
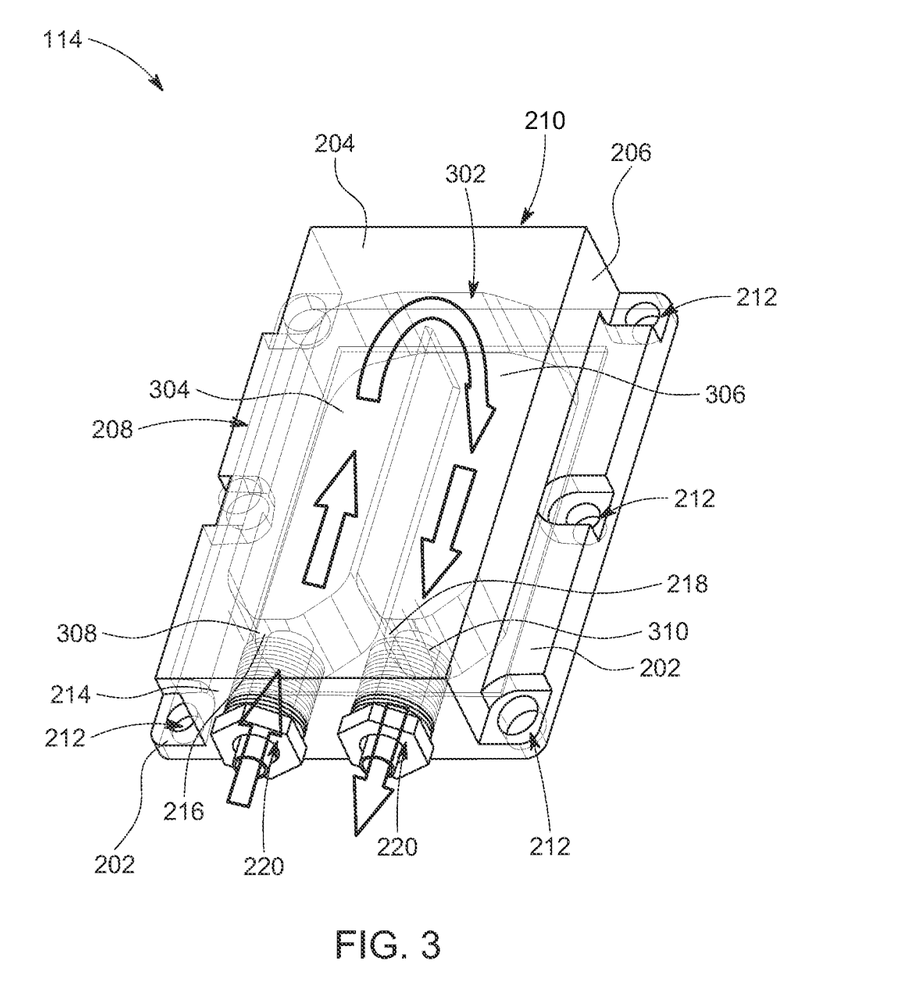
FIG. 3 is a see-through perspective view of the example cold plate of FIG. 2, demonstrating the liquid flow.

FIG. 3 is a see-through perspective view of the cold plate 114, demonstrating the liquid flow (shown via arrows) through the cold plate 114. Like elements in FIGS. 1-2 are labeled with the same reference numbers in FIG. 3. In addition to the previously mentioned components, the cold plate 114 also includes an internal chamber 302. The internal chamber 302 is located inside of the cold plate 114 and extends from the bottom panel 214 toward the top panel 210 in a generally "U" shaped outline, where the curved portion of the "U" is located near the top panel 210. The internal chamber 302 contains a first internal conduit 304 and a second internal conduit 306. The first internal conduit 304 has an opening 308 at the first socket 216 and extends toward the top panel 210. The first internal conduit 304 then angles toward the first side panel 206, where it merges with the second internal conduit 306. The second internal conduit 306 has an opening 310 at the second socket 218 and extends toward the top panel 210 then angles toward the second side panel 208, where it merges with the first internal conduit 304.

The function of the connectors 220 is to secure the tubes 112, 128 carrying cooling liquid to the cold plate 114. Thus, cooling liquid may enter the cold plate 114 through the connector 220 of the first socket 216 and into the chamber 302 to decrease the temperature within the cold plate 114. The cooling liquid may enter the chamber 302 through the first internal conduit 304 at a relatively low temperature. The heat absorbed by the cold plate 114 from the electronic component, such as the processor, may then be transferred to the cooling liquid, thereby decreasing the temperature of the components under the cold plate 114. As a result, the temperature of the cooling liquid increases as the cooling liquid travels through the chamber 302 from the first internal conduit 304 to the second internal conduit 306. Thus, the temperature of the cooling liquid exiting the second internal conduit 306 is generally higher than the temperature of the cooling liquid entering the first internal conduit 304. As the warmer liquid flows through the second internal conduit 306, it exits the second socket 218, after having absorbed the heat. The connector 220 at the end of the second socket 218 is connected to an outlet tube, such as the outlet tube 128 (shown in FIG. 1), where the liquid from the second internal conduit 306 and the second socket 218 exits the cold plate 114.

In some implementations, the cooling liquid flowing from the first socket 216 to the second socket 218 may experience an increase in pressure as it exits the cold plate 114. The increase in pressure may be due to the smaller diameter of the second socket 218 relative to the diameter of the second internal conduit 306. The pressure increase may also be due to the smaller diameter of the connector 220 relative to the diameter of the second internal conduit 306. As a result, the pumping pressure of the cooling liquid may have to be adjusted to reduce the pressure buildup and increase the flow rate of the cooling liquid out of the second socket 218. In some implementations, the design of the connector 220 functions to reduce the difference in the diameter between the second internal conduit 306 to the second socket 218 without having to increase the pumping pressure of the cooling liquid. As will be explained, the connector 220 includes a sleeve and a nut that provide a smoother transition between the larger diameter of the second internal conduit 306 and the smaller diameter of the second socket 218, as will be described herein.

Figure 4A:
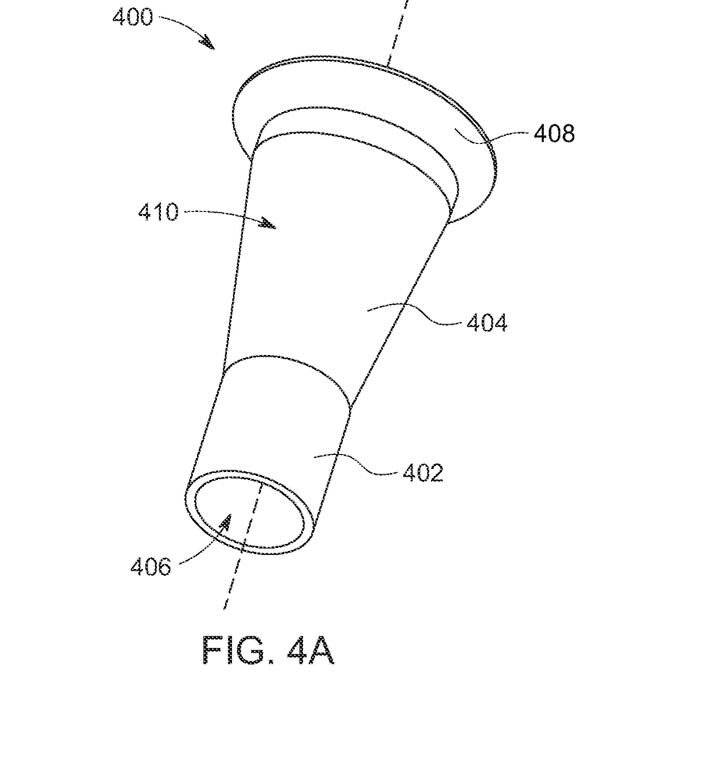
FIG. 4A is a perspective view of a sleeve of the socket of the example cold plate of FIG. 2.
Figure 4B:
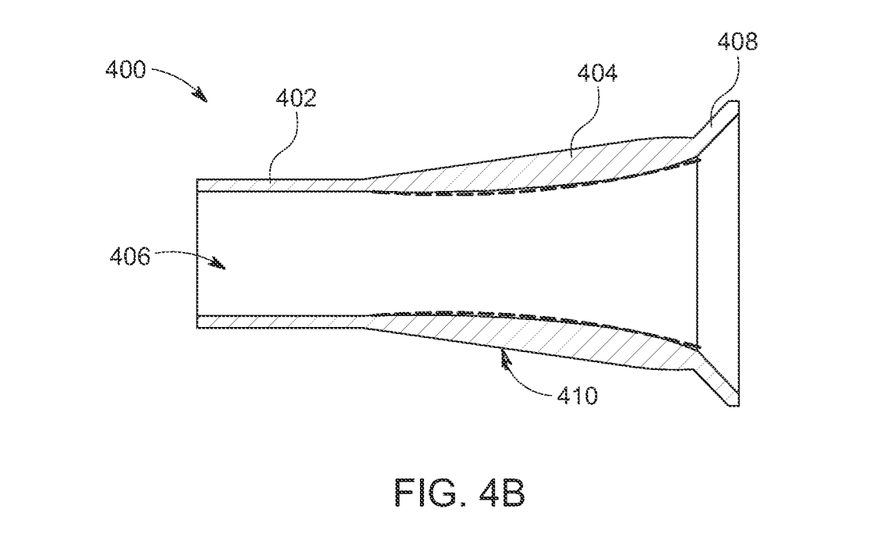
FIG. 4B is a cross-sectional view of the sleeve of FIG. 4A.

FIG. 4A is a perspective view of a sleeve 400 that is one component of the connector 220 in FIG. 3. FIG. 4B is a cross-sectional view of the sleeve 400. The sleeve 400 is generally tubular in shape and includes an external surface 410 and an internal bore 406. The external surface 410 may include a flared annular portion 408, a first portion 402 and a second portion 404. The flared annular portion 408 extends away from the internal bore 406. The first portion 402 and the second portion 404 of the sleeve 400 define the internal bore 406 for the cooling liquid. The inner diameter of the first portion 402, where the inner diameter is closer to the internal bore 406, is generally uniform. The inner diameter of the second portion 404 increases between the first portion 402 and the flared annular portion 408.

FIG. 4B is a cross-sectional view of the sleeve 400. The internal bore 406 widens between the first portion 402 and the second portion 404, and widens more between the second portion 404 and the flared annular portion 408. As shown in FIG. 4B, the shape of the internal bore 406 in the second portion 404 follows a non-linear curve to increase the cross section. The curvature of the interior section of the second portion 404 is a function of the flexibility desired due to a compression force applied the flared annular portion 408, which is described in more detail below. The curvature of the interior section of the second portion 404 is also intended to smooth the transition diameter between the first portion 402 and the flared annular portion 408. As displayed, the circular cross section of the flared annular portion 408 increases at a greater rate than the second portion 404. Therefore, the internal bore 406 widens from the first portion 402 to the second portion 404, and widens more from the second portion 404 to the flared annular portion 408, along the length of the sleeve 400.

Figure 5A:
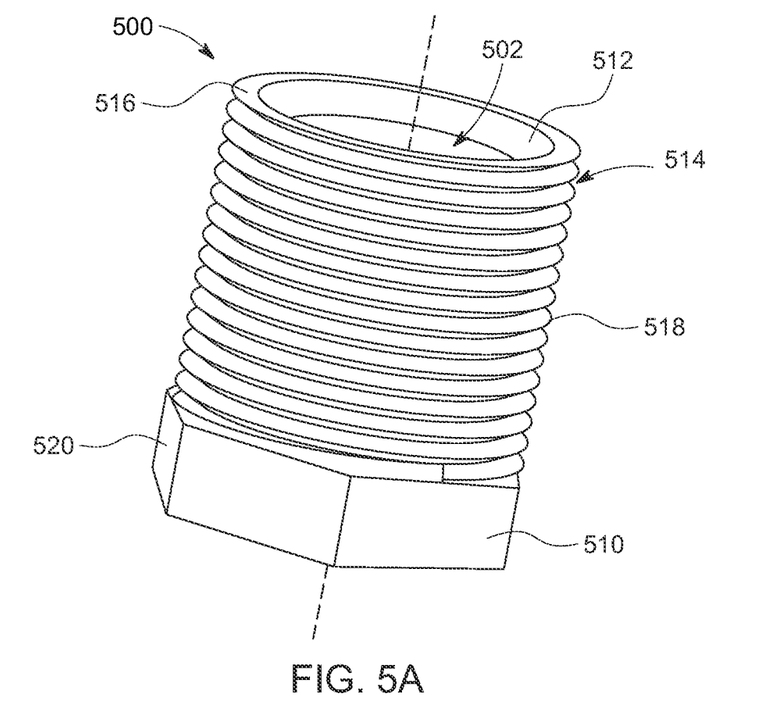
FIG. 5A is a prospective view of a nut of the socket of the example cold plate of FIG. 2.
Figure 5B:
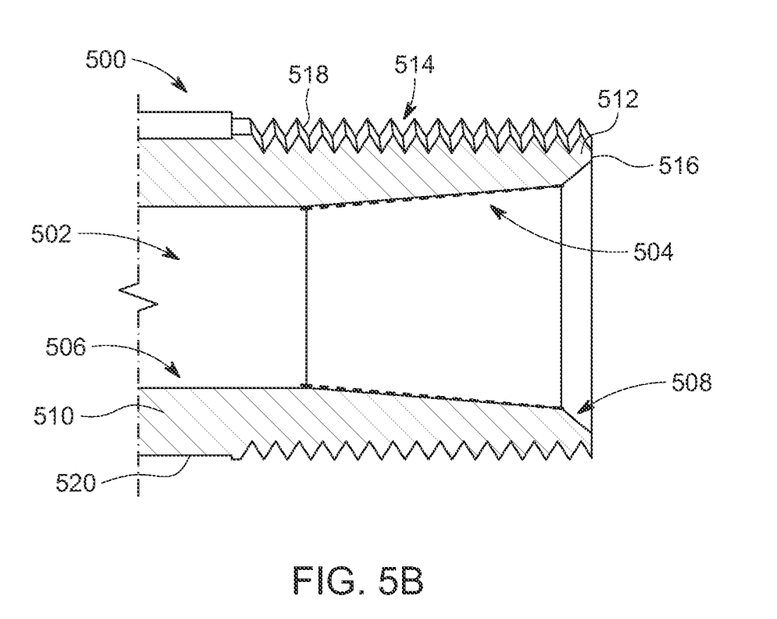
FIG. 5B is a cross-sectional view of the example cold plate of FIG. 5A.

FIG. 5A is a perspective view of a nut 500 that is one component of the connector 220 in FIG. 3. FIG. 5B is a cross-sectional view of the nut 500. The nut 500 includes a head portion 510, a tubular inlet 502, exterior threads 514, a flared portion 512, a flat top collar portion 516, and an exterior surface 518. The exterior threads 514 are located on the exterior surface 518 of the nut 500. The head portion 510 does not include the exterior threads 514. The head portion 510 includes substantially flat sides 520, perpendicular to the tubular inlet 502. In this example, there are six flat sides in a hexagon shape. The number of flat sides may range between three and ten. The sides of the head portion 510 may allow a user to either use a tool or their hand to grip the nut 500 for attachment to the head portion 510. The diameter of the tubular inlet 502 gradually increases from the head portion 510 to the flared portion 512 of the nut 500. Thus, the inner diameter of the nut 500 is not uniform throughout the entire length of the nut 500. The exterior threads 514 allow for the nut 500 to be securely fastened to a socket, such as the sockets 216, 218, when mated to matching threads. The flat top collar portion 516 allows the nut 500 to fit into a tight location because the exterior threads 514 extend up to the flat top collar portion 516.

FIG. 5B is a cross-sectional view of the nut 500. The tubular inlet 502 of the nut 500 extends from the head portion 510 to the flared portion 512. The tubular inlet 502 includes a first section 506, followed by a second section 504, and a third section 508. The first section 506 has a constant diameter. The second section 504 has a sloped interior. Therefore, the diameter of the second section 504 increases from the point of intersection of the first section 506 to the intersection with the third section 508. The third section 508 has a slope at a greater angle than the slope of the second section 504. Thus, the inner diameter of the nut 500 near the flat top portion 516 is much greater than the diameter near the head portion 510. Therefore, the tubular inlet 502 widens from the tubular inlet 502 at the first section 506 to the second section 504, and widens more from the second section 504 to the third section 508, along the length of the nut 500.

Figure 6A:
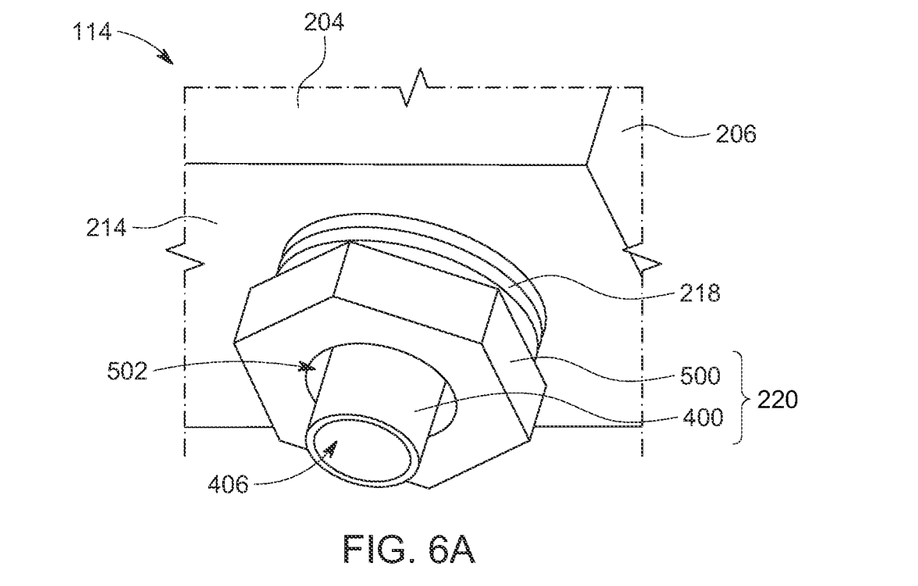
FIG. 6A is a close-up view of the socket of the example cold plate of FIG. 2.

FIG. 6A is a close-up view of the second socket 218 and the connector 220 on the cold plate 114. Like elements in FIGS. 1-5B are labeled with the same reference numbers in FIGS. 6A-B. FIG. 6A also shows the connection located at the first socket 216 (shown in FIGS. 2-3) and the connector 220 because both sockets 216, 218 have a connector 220. The connectors 220 for the sockets 216 and 218 both function to provide better seals for the liquid connection and prevent or minimize leakage. The following description relates to the connector 220 of the socket 218, but both sockets function in a similar manner. The second socket 218 is a threaded hole on the bottom panel 214 to provide a securable attachment for the connector 220. The socket does not protrudes from bottom panel. The socket is a hole with thread for connector 220 to fasten onto. The protrusion is in fact the connector 220 itself The connector 220 may consist of the nut 500 and the sleeve 400, which are both generally cylindrical with increasing diameters near the second socket 218. The nut 500 and the sleeve 400 each include an inner diameter and an outer diameter. Thus, the sleeve 400 includes the internal bore 406 and the nut 500 includes the tubular inlet 502. The internal bore 406 allows for fluid to flow into and out of the second socket 218.

The connector 220 and its components may be fabricated from a ductile, flexible, malleable, insulative, and heat resistant material that may temporarily deform while maintaining its structural integrity when pressure is applied. For example, the connector 220 may be made of a metal such as, but not limited to, steel, tin, aluminum, nickel, brass, copper, and titanium. In such implementations, the connector 220 may be permanently coupled to a tube by a method such as, but not limited to, brazing, soldering, or welding. Thus, since the connector 220 is permanently coupled to a tube, the risk of leakage is greatly reduced. The tube may also be made of a plastic material such as, but not limited to, polyimide, polyvinyl chloride, polytetrafluoroethylene, polyamide-imide, polyphenylene sulfide, polyphenylene oxide, polyethylene, and polystyrene. In such implementations, the tube may be removably coupled to the connector 220 by method such as, but not limited to, tying and adhering.

Figure 6B:
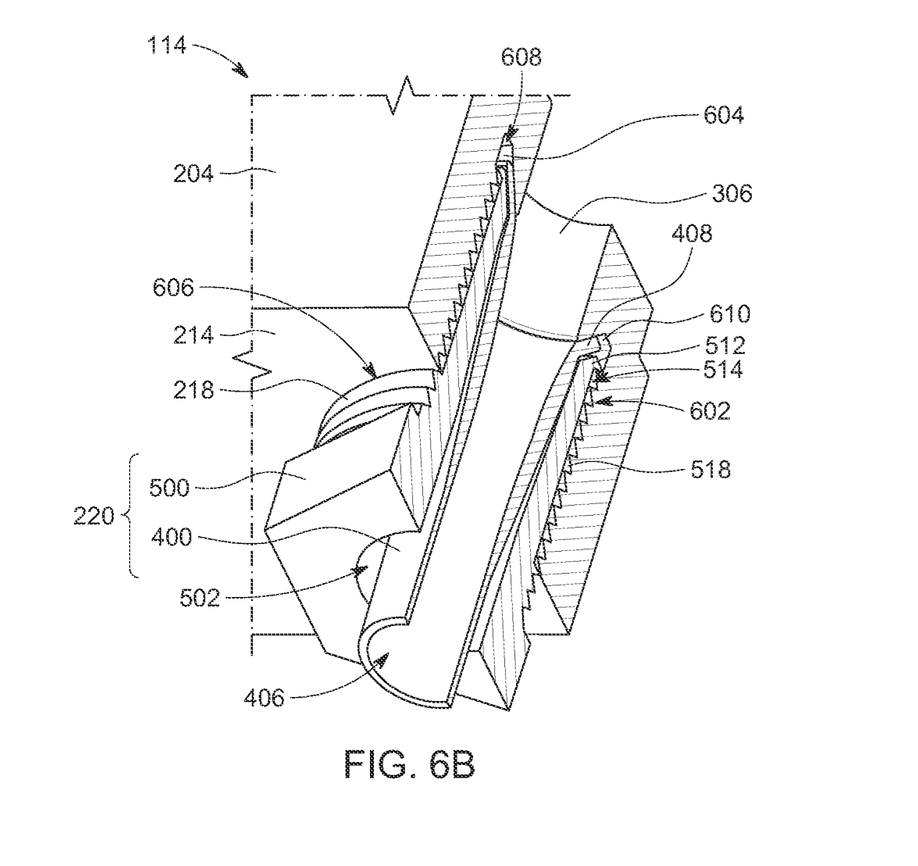
FIG. 6B is a close-up, vertical cross-sectional view of the example cold plate of FIG. 6A.

FIG. 6B is a close-up view of the second socket 218 and the connector 220. As shown, the second socket 218 includes interior threads 602 extending from the bottom panel 214 toward the second internal conduit 306. The second socket 218 also includes a gap 604 at a distal end 608. The distal end 608 is near a location where the second socket 218 intersects with the second internal conduit 306. The gap 604 is initially rectangular before the sleeve 400 or the nut 500 is installed. The gap 604 shifts to a triangular shape, which is smaller than the initial rectangular shape, when the sleeve 400 and the nut 500 are installed. The shape of the gap 604 changes because the exterior threads 514 and the flat top portion 516 of the nut 500, and the flared annular portion 408 of the sleeve 400 intersect with the second internal conduit 306. The second socket 218 includes an exterior circular collar 606 that abuts the exterior surface 518 of the nut 500 when fully engaged. An interior cylindrical chamber with interior threads 602 has one end defined by the collar 606 and a distal end 608 that provides access to the interior threads 602. An annular shoulder 610 is provided at the distal end 608 of the second socket 218 that serves as a stop to the flared annular portion 408 of the sleeve 400. Similarly, the annular shoulder 610 applying pressure at the distal end 608 serves as a stop to the flat top portion 516, either directly or indirectly via the sleeve 400.

Additionally, exterior threads 514 of the nut 500 intersect with the gap 604 when securely mated with the interior threads 602. Thus, the tighter the connection between the exterior threads 514 and the interior threads 602, the smaller the gap 604 will be when the nut 500 is rotated into the second socket 218. Furthermore, the flared annular portion 408 of the sleeve 400 is inserted in the gap 604. Thus, the second socket 218 allows for the nut 500 and the sleeve 400 to be secured, when the sleeve 400 is placed in the second socket 218. The nut 500 includes exterior threads 514 that mate with the interior threads 602 on the second socket 218. The nut 500 is then rotated, engaging the exterior threads 514 to the interior threads 602 to secure the sleeve 400 into the socket 218. The nut 500 includes an angled portion 512 on the exterior surface 518 that angles away from the internal bore 406. The sleeve 400 also includes a flared annular portion 408 located at the distal end 608 near the second internal conduit 306. The flared annular portion 408 angles away from the end of the internal bore 406. The purpose of the angled portion 512 of the nut 500 is to compress the flared annular portion 408 of the sleeve 400. As the exterior threads 514 of the nut 500 are rotated, the angled portion 512 gets closer to the flared annular portion 408. The annular shoulder 610 stops the flared annular portion 408 from extending further upward into the second internal conduit 306. Therefore, the angled portion 512 may compress the flared annular portion 408, securing it in place. Thus, the nut 500 secures the sleeve 400 in the cold plate 114.

Figure 7:
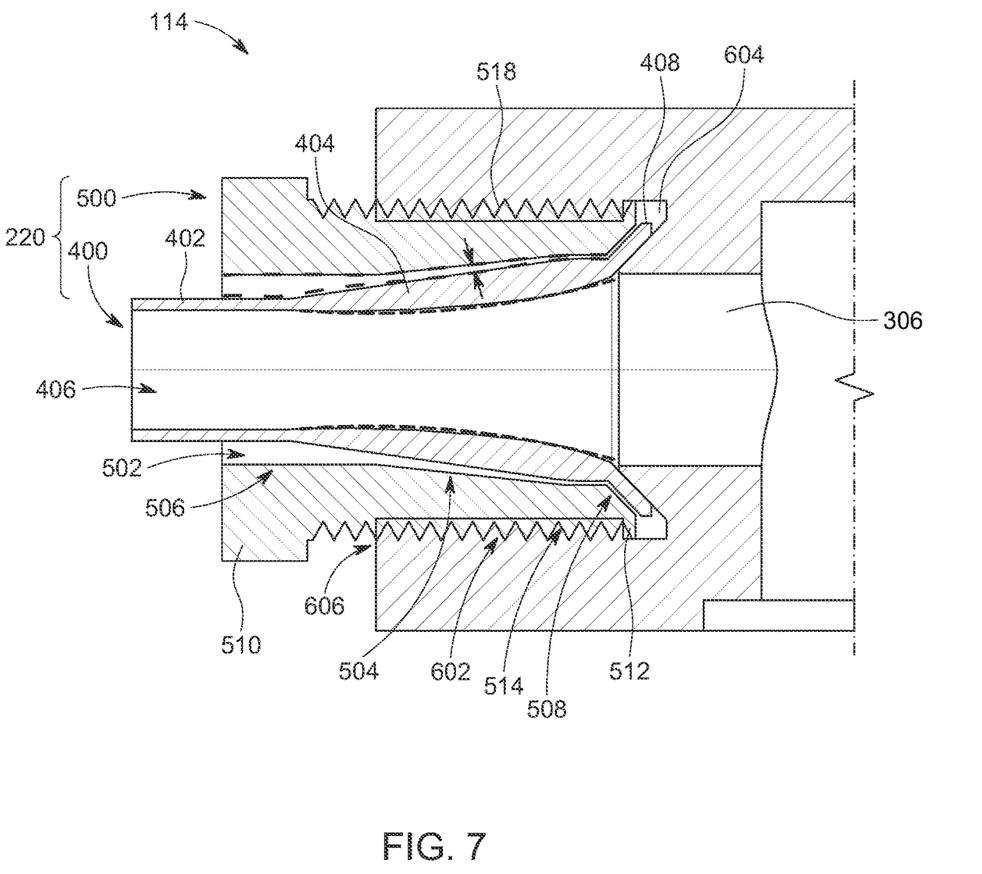
FIG. 7 is a cross-sectional view of an example nut and sleeve in the socket of the example cold plate of FIG. 2 demonstrating compression force.

FIG. 7 is a cross-sectional view of the nut 500 and the sleeve 400 in the second socket 218 demonstrating compression force. Like elements in FIGS. 1-6B are labeled with the same reference numbers in FIG. 7. In the cold plate 114, the sleeve 400 fits into the second socket 218 and the nut 500 fits over the sleeve 400 to secure it to the second socket 218. As the nut 500 tightens in the second socket 218, the cross-section of the tubular inlet 502 of the nut 500 decreases from the compressive force. The gap 604 between the flared annular portion 408, the interior threads 602, the exterior threads 514, and the annular back wall of the second socket 218 decreases when the sleeve 400 and the nut 500 are inserted and secured in the second socket 218. However, the gap 604 may still exist when both the sleeve 400 and the nut 500 are inserted. Thus, the angled portion 512 of the nut 500 and flared annular portion 408 of the sleeve 400 abut each other when installed into the second socket 218. Furthermore, the angled portion 512 and the flared annular portion 408 may apply a force that compresses the sleeve 400 and the nut 500 together to ensure each are secured.

The connector 220 may be used for any connection such as the second socket 218, the first socket 216, other things like manifolds such as fittings, adapters, and the like. Once the nut 500 and the sleeve 400 are properly fastened, cooling liquid may flow through the internal bore 406 and out of the cold plate 114 at a rate that does not cause a high pressure area because of the smoother transition between the changes in diameter due to the slopes of the connector 220. Therefore, the pump pressure of the cooling liquid flowing through the cold plate 114 may stay consistent for the liquid cooling system disclosed herein.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A device for a computing system, the device comprising:
    a cold plate having an internal conduit;
    a socket; and
    a connector extending from the cold plate, wherein the connector is removably coupled to the socket, the connector having:
        an outer end and an inner end;
        a nut having an exterior surface mating with a corresponding interior surface of the socket, the nut further having a tubular inlet with an interior surface having an inlet tapered profile that gradually increases from the outer end towards the inner end; and
        a sleeve having an internal bore and an external surface abutting the tubular inlet of the nut, the external surface of the sleeve having a sleeve tapered profile that gradually increases form the outer end towards the inner end, the external surface of the sleeve being separated from the interior surface of the tubular inlet by a gap between at least a portion of the inlet tapered profile and the sleeve tapered profile;
    wherein the internal conduit is coupled to the inner end of the connector to circulate cooling liquid through the body.

2. The device of claim 1, wherein the nut includes an angled portion and the sleeve includes a flared portion for assisting in securing the nut and the sleeve in the internal conduit, the sleeve being a separate component than the nut, the angled portion of the nut being at the inner end and receiving within at least a portion of the flared potion of the sleeve, the angled portion applying a compressive portion to the flared portion, the flared portion applying a compressive portion to the socket.

3. The device of claim 1, wherein the outer end of the connector is configured to be coupled to a tube.

4. The device of claim 1, wherein the exterior surface of the nut of the connector includes a plurality of threads configured to mate with threads on the socket.

5. The device of claim 1, wherein the internal conduit is configured to distribute a cooling liquid that exits the cold plate.

6. The device of claim 1, wherein the sleeve tapered profile has the shape of a spline curve.

7. The device of claim 1, wherein the device is formed from a metal.

8. The device of claim 1, wherein the internal conduit is U-shaped.

\* \* \* \* \*